Jan. 28, 1969 R. S. FOW ET AL 3,425,021

METHOD AND APPARATUS FOR CONNECTING LEADS TO A PRINTED CIRCUIT BOARD

Filed July 28, 1966 Sheet 1 of 2

INVENTORS
ROBERT S. FOW &
BY JOEL R. OBERMAN
Edward J. Norton
Attorney

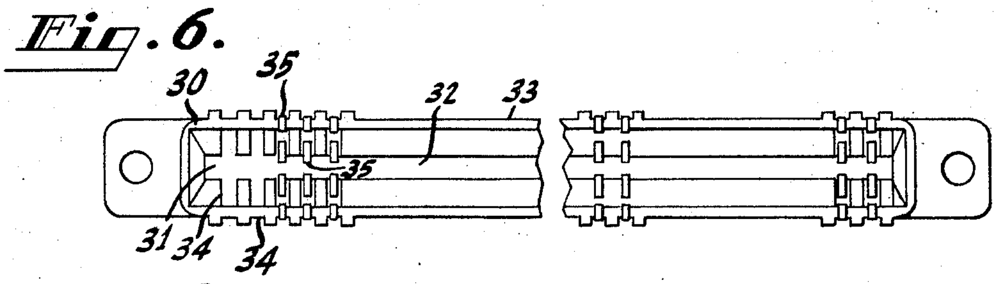
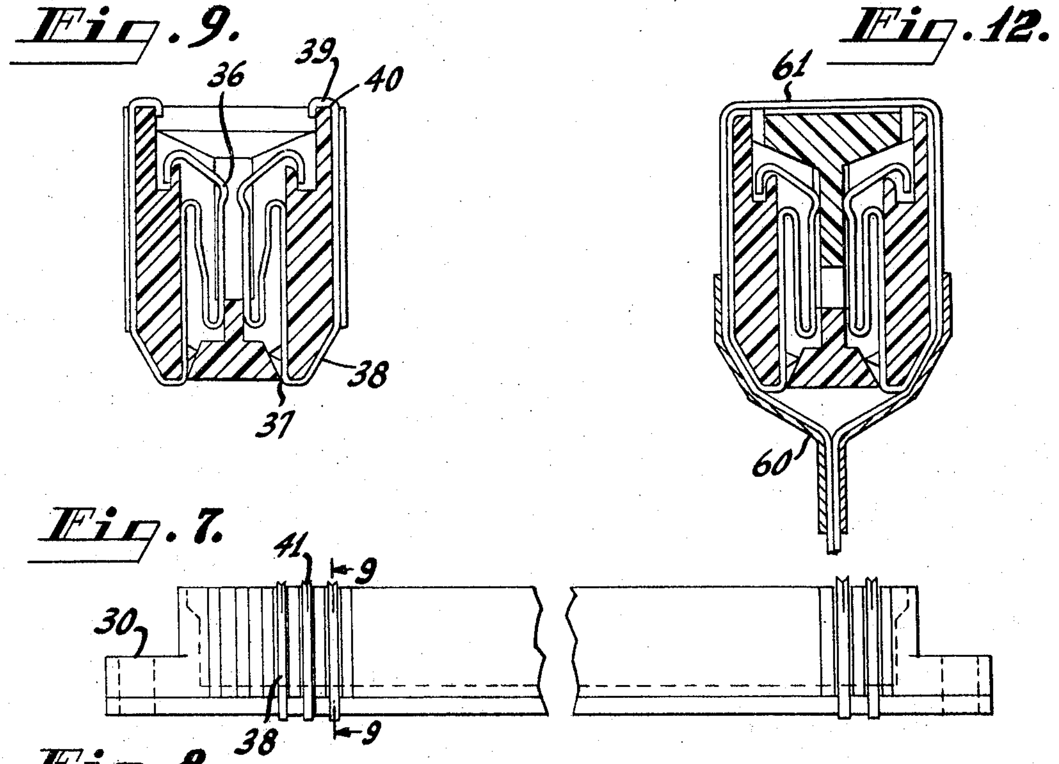
FIG. 9, FIG. 12, FIG. 7
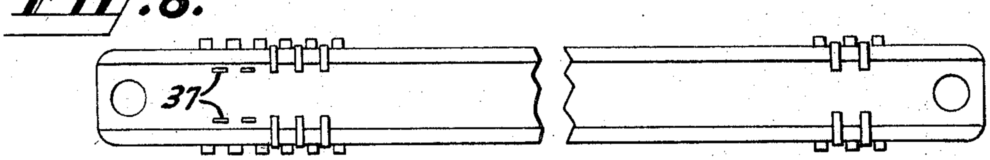
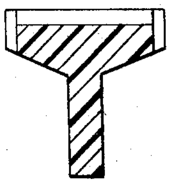
FIG. 10.
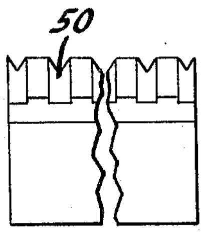
FIG. 11.
INVENTORS
ROBERT S. FOW &
BY JOEL R. OBERMAN
Edward J. Norton
Attorney United States Patent Office 3,425,021

Patented Jan. 28, 1969

3,425,021

METHOD AND APPARATUS FOR CONNECTING LEADS TO A PRINTED CIRCUIT BOARD

Robert S. Fow, Plymouth Meeting, Pa., and Joel R. Oberman, Cinnaminson, N.J., assignors to Radio Corporation of America, a corporation of Delaware Filed July 28, 1966, Ser. No. 568,459

U.S. Cl. 339—17 5 Claims

Int. Cl. H05k 1/12, 3/04

ABSTRACT OF THE DISCLOSURE

Disclosed is a method and apparatus for connecting leads to a circuit substrate, e.g., a printed circuit board, using an intermediary connecting device. The connecting device, which is formed with a slot adopted to receive the leading edge of the circuit board, is enwrapped with the leads and thereafter dip-soldered to provide a connection between the leads and the device. The portions of the leads which span the gap defined by the slot are thereafter cut to permit the insertion of the circuit board.

This invention relates to a method and apparatus for making electrical connections and more specifically to a method and apparatus for connecting wire leads to a printed circuit board using an intermediary connecting device.

In the manufacture of modern electronic equipment it is often necessary to cause a number of electrical leads to be physically and electrically connected to the terminal tabs arranged along one edge of a printed circuit board. These connections are generally made either by directly attaching the wire leads to the circuit board and securing them thereto in some appropriate manner or by utilizing an intermediary connecting device. As the number of wire leads to be connected is increased, it becomes increasingly more advantageous to employ the connecting device technique.

In determining what type of an intermediary connecting device should be used, a prime consideration is often whether the connections to be made are to be permanent in nature or if the feature of removability is desirable. If there is little likelihood that the connections, once made, will be disturbed, it is possible and advantageous to use a simple connecting element which would serve primarily as a means for arranging the incoming leads in a neat and orderly fashion thereby facilitating the process for connecting them to the circuit board. This type of a connecting device will be hereinafter described and referred to as a post type edge connector. If, however, it is determined that the feature of removability is desirable for purposes of maintenance or recurrent replacement then it would be advantageous to use a connecting device such as a bellows action edge connector. This type of a connecting device will be hereinafter described and referred to as a pluggable or removable type edge connector.

One of the major problems associated with using an intermediary connecting device occurs in mechanically and electrically fastening the incoming leads, particularly if the diameters are of small dimension, to the connector itself. In the past this has generally been accomplished through the use of soldering techniques whereby a wire lead is cut, stripped, attached and soldered. These techniques have proven to be costly, time consuming, and inefficient.

Accordingly, it is an object of this invention to provide a method which will enable soldered connections to be made between a plurality of wire leads and a connecting element in a rapid, efficient, and inexpensive manner.

Another object of this invention is to provide a simple edge connector for use in the method of this invention that lends itself to connector assemblies which are permanent in nature.

A further object is to provide an edge connector for use in the method of the instant invention which may be easily removed from a circuit board where such a feature is deemed advantageous.

In accordance with one embodiment of this invention electrically conductive wire leads are wrapped around a post type connector. The connector is fabricated of a dielectric material having a slot positioned along its longitudinal axis capable of receiving the edge of a printed circuit board. To facilitate positioning of the leads it is desirable for the connector to have a plurality of grooves disposed in a manner such that the wrapped leads when resting therein span the gap formed at the top of the walls defining the slot. The maximum number of leads that may be used is determined by the length of the connector and the spacing of the grooves. The inner surfaces of the grooves, which make contact with the wrapped leads, should be precoated with a conductive material. These portions of the connector are then dipped into a bath of liquid solder resulting in a solder connection between the leads and the connector. The duration of the solder dipping operation is in the order of 5 seconds and depends on variations in the make-up of the lead and/or the conductive coating within the grooves. To insure contiguity between the leads and the conductive material during the dipping process, the leads may be secured at the back of the connector by a piece of tape or other appropriate means.

When a large number of incoming leads are to be attached to the connector and it is desirable to keep the leads electrically isolated from each other, a solder stripping lead may be used whereby the insulation around the wire is stripped away and the solder connection formed when the insulated lead is submersed in a liquid solder bath heated to a temperature of approximately 690° F.

After the dipping process is completed it is necessary to remove those portions of the leads which span the gap formed at the top of the slot thereby permitting the insertion of the edge of the circuit board. This may be done by cutting out entirely that section of each lead which spans the gap or, as an alternative, by merely cutting the leads in the center of the gap and thereafter using a circuit board that has notches along its leading edge. Upon the insertion of the circuit board these notches tend to comb the leads parallel to each other as they are bent and pushed into the slot with the board thereby preventing them from coming into contact with each other and causing short circuits. After the insertion of the circuit board into the slot, the individual leads are connected to the terminal tabs arranged along the edge of the circuit board which register with the grooves containing said leads.

The novel features of the method and apparatus provided by this invention, as well as additional objects and advantages thereof, will be understood more readily from the following description when read in conjunction with the accompanying drawings in which:

FIGURES 6, 7 and 8 are top, side and bottom views, respectively, of a new and novel edge connector of the pluggable or removeable type provided by this invention and used in a further embodiment thereof;

FIGURE 9 is a cross-sectional view taken along section 9—9 of FIGURE 7;

FIGURES 10 and 11 are two views of a cover which may be used with the edge connector of FIGURES 6 through 9 in a manner to be hereinafter discussed; and FIGURE 12 is a further cross-sectional view of the edge connector with the cover as shown in FIGURE 10 inserted therein.

Figure 1:
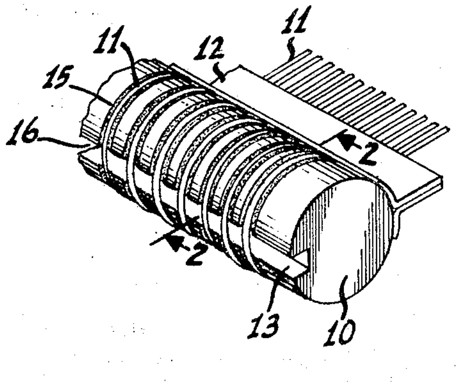
FIGURE 1 is a perspective view of a post type edge connector, with leads attached, as used in one embodiment of this invention.
Figure 2:
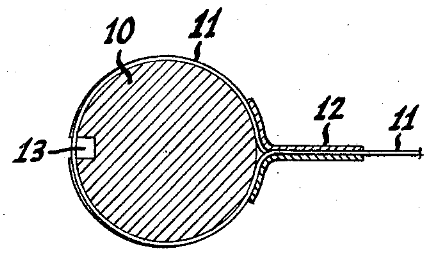
FIGURE 2 is a cross-sectional view taken along section 2—2 of the assembly shown in FIGURE 1.

Referring in more detail to the accompanying drawings, FIGURES 1 and 2 shown an assembly prepared for solder, said assembly comprising a post type edge connector 10, wire leads 11, and means 12 for securing the leads 11 in place.

The connector post 10 is composed of a dielectric material. It has a slot 13 positioned along its longitudinal axis and its peripheral surface is impressed with parallel disposed grooves 15 extending transversely to said axis, the surfaces of which are coated with electrically conductive material. As shown in FIG. 2, the grooves 15 are formed such that one end of each groove terminates at the slot 13 with the other end of each groove terminating distal of the slot.

The leads 11 are of the solder stripping type, for example, RCA No. 2010883, and consists of a wire that has been coated with a layer of insulation which will be stripped off when exposed to a predetermined temperature. The leads 11 are wrapped about the connector post 10 in such a manner that they span the gap 16 formed at the top of the slot 13 and rest in the groves 15 thereby making contact with the conductive material therein.

A piece of cloth tape 12 is applied to serve as means for securing the leads within the grooves and to an act as a strain relief.

Figure 3:
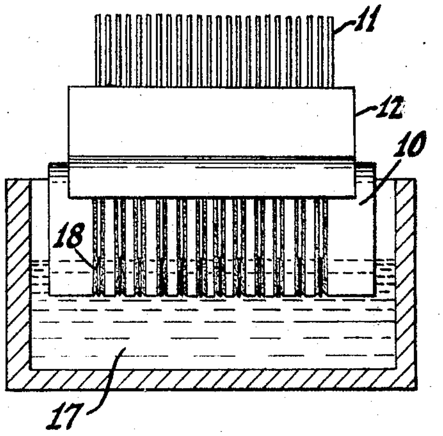
FIGURE 3 is a view, partially in cross-section, of a solder bath used in the process of the present invention and showing one manner of immersing the assembly of FIGURE 1.

Referring now to FIGURE 3, the next stage in the process is to submerse the assembly into a bath of liquid solder 17. The temperature of the solder should be high enough to strip the insulation from the submersed leads which are resting in the grooves thereby resulting in a soldered connection between the stripped wire leads 18 and the conductive material coating the surfaces of the grooves. To better insure a good solder connection, the conductive material within the grooves may be pretinned and treated with a fluxing agent.

Figure 4:
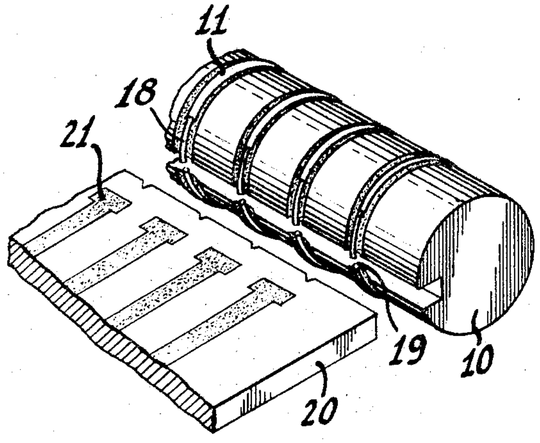
FIGURE 4 is a perspective view of the post type edge connector of this invention, after the dipping process has been completed, about to receive the edge of a printed circuit board.
Figure 5:
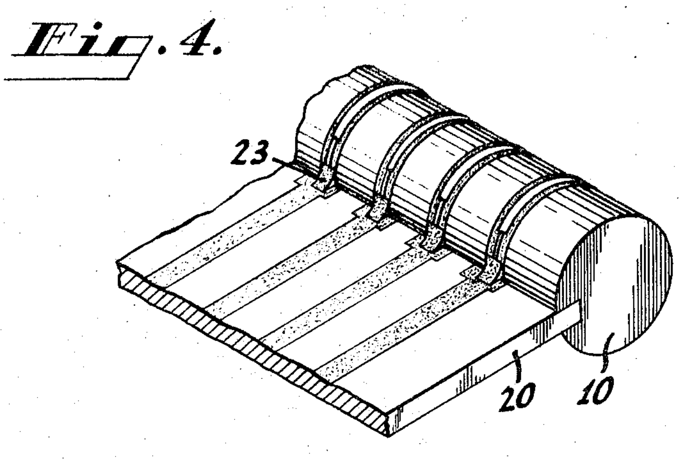
FIGURE 5 is a perspective view of a completed assembly including a printed circuit board.

Referring to FIGURES 4 and 5, after the assembly is removed from the solder bath, the conductive leads 11 which span the gap 16 at the top of the slot 13 are cut in the center 19. A printed circuit board 20, having a plurality of spaced terminal tabs 21 arranged along one edge thereof, and notches 22 along said edge, is brought in proximity with the slot 13 so that the notches 22 are indexed with the now exposed wire leads 18. When the edge of the circuit board is inserted in the slot 13 the notches 22 tend to comb the cut wires 18 into the slot 13 with the board 20 in a parallel fashion thereby preventing their making contact with each other and causing a short circuit. As an alternative, the portions of the wire leads spanning the gap may be totally cut away thereby obviating the need for a notched circuit board.

After the circuit board 20 is inserted into the slot, the wire leads 18, which have now been soldered within the grooves, may be electrically connected to the terminal tabs 21 on the circuit board 20 using bridge solder techniques 23 or other appropriate means.

In a further embodiment of the process provided by the instant invention requiring the utilization of a removeable type of edge connector, the connecting device provided by this invention as shown in FIGURES 6 through 9, may be used.

In FIGURES 6 through 9 the connector described is made of a molded piece of insulation 30 formed with a longitudinal slot 31 capable of receiving the edge of a printed circuit board. Both the inner 32 and outer 33 surfaces of the side walls defining the slot 31 are engraved with a plurality of groves 34, disposed in a parallel fashion, and fitted with conductive elements 35. The portions 36 of the contact elements 35 lying within the slot 31 are formed such that they are capable of being separated by the insertion force of a printed circuit board, but have sufficient compression between them to secure the board in place after its insertion, while at the same time making electrical contact with the terminal tabs along the edge of said board.

The base of the connector housing contains a series of apertures 37 extending therethrough to the surface defining the base of the slot. Segments 38 of the contact elements 35 are threaded through these apertures and then folded rearwardly so as to enable them to rest in the outer grooves. These segments terminate in a hook portion 39 which is engaged by and over the wall shoulders 40 defining the slot. The segments of the contact elements may contain V channels 41 to serve as guides for the insulated wire leads which are to be wrapped thereabout.

To prevent possible splattering of solder onto the inner contacts of the connector during the dipping operation, a cover, as shown in FIGURES 10 and 11, may be inserted into the slot of the conector. Said cover may also have channels 50 engraved in its top surfaces which will register with the channels 41 of the contact elements 35 and further help to guide the wrapped leads. FIGURE 12 shows a cross-sectional view of the connector with such a cover inserted therein and secured by the spring-like action of the inner contacts.

After the cover has been put in place, the wire leads 61 are wrapped around the connector such that they fall within the aforementioned guide channels. The wrapped leads may then be temporarily secured in place at the back of the connector with a strip of tape 60 or other appropriate means.

Thereafter the assembly is submersed in a bath of liquid solder, the insulation stripped from the wire leads, and the contact elements on which they lie.

Upon the removal of the assembly from the solder bath, the segments of the leads 61 confining the cover are severed from the assembly thereby permitting the removal of said cover.

After the cover is removed from the slot of the connector a printed circuit board may be inserted in its place. Once inserted the inner contact elements secure it in place and also serve as means for connecting the terminal tabs upon the edge of the printed circuit board to the input leads of the connector.

What is claimed is:

1. A method for attaching leads to an edge connector fabricated of a dielectric material having a slot capable of receiving the edge of a printed circuit board, said connector further having a plurality of grooves disposed in its peripheral surfaces, said grooves containing conductive material, the steps comprising:

(a) enwrapping said conector with a plurality of leads such that each of said leads spans the gap defined by the side surfaces of the slot and makes contact with the conductive material contained within the surfaces defining said grooves;

(b) submersing said assembly into a bath of liquid solder;

(c) withdrawing said assembly from said bath of liquid solder thereby permitting the solidification of the solder connections; and then (d) removing those portions of the leads which span said gap.

2. The method as set forth in claim 1 wherein said leads are insulated with a material which is stripped therefrom in response to the heating thereof to at least a given temperature and wherein said assembly is submersed into a bath of liquid solder having at least said given temperature.

3. The method according to claim 2 further comprising the steps of inserting the edge of a printed circuit board between the parallel surfaces defining the sides of the slot and securing the conductive material within the surfaces defining said grooves to the terminal conductive tabs along the edge of said circuit board.

4. An edge connector for use with a printed circuit substrate comprising:

a member fabricated of a dielectric material, said member formed with a slot positioned along its longitudinal axis adapted to receive the leading edge of said circuit substrate;

said member being further formed with a plurality of parallel grooves disposed within the peripheral surfaces of said member, said grooves containing a conductive coating on the surfaces thereof;

one end of each of said grooves terminating at either side of said slot, the remaining end of each of said grooves terminating distal of said slot;

each of said grooves adapted to communicate only with the circuitry on the side of said substrate proximate said groove;

whereby electrical leads may be placed within grooves and conections established between said leads and the circuitry upon the surface of said substrate communicating with said grooves.

5. In combination with an electrical edge connector assembly for use with printed circuit boards, said assembly having a housing of a dielectric material containing a slot positioned along its longitudinal axis, the bottom surface defining said slot having a plurality of apertures, the inner surfaces of the walls defining the sides of said slot having a plurality of pairs of opposed channels extending vertically within said slot, said channels being fitted with contact members capable of securing the edge of a printed circuit board inserted there between, and said contact members extending through said apertures, the improvement comprising; a second plurality of channels disposed within the peripheral surfaces of the wall defining said slot, said second plurality of channels containing the extended portions of said contact members which have been threaded through said apertures and folded rearwardly so as to lie therein, said contact members terminating in hooked portions which are engaged by and over the wall shoulders separating the inner surfaces of the walls defining said slot from the peripheral surfaces of said walls.

References Cited

UNITED STATES PATENTS

| | | | |
|---|---|---|---|
| 1,767,715 | 6/1930 | Stoekle | 338—300 |
| 2,870,424 | 1/1959 | Franz. | |
| 2,922,978 | 1/1960 | Engel | 339—17 |
| 3,164,750 | 1/1965 | Miller. | |
| 3,234,499 | 2/1966 | Paholek et al. | |
| 3,336,564 | 8/1967 | McCaughey | 339—99 |
| 3,069,487 | 12/1962 | Strother | 339—17 XR |

MARVIN A. CHAMPION, *Primary Examiner.*

PATRICK A. CLIFFORD, *Assistant Examiner.*

U.S. Cl. X.R.

339—176; 29—626, 629, 630